United States Patent
Imada et al.

(10) Patent No.: US 9,765,175 B2
(45) Date of Patent: Sep. 19, 2017

(54) MODIFIED HYDROXY NAPHTHALENE NOVOLAK RESIN, PRODUCTION METHOD FOR MODIFIED HYDROXY NAPHTHALENE NOVOLAK RESIN, PHOTOSENSITIVE COMPOSITION, RESIST MATERIAL AND COATING

(71) Applicant: DIC Corporation, Tokyo (JP)

(72) Inventors: Tomoyuki Imada, Ichihara (JP); Yusuke Sato, Ichihara (JP)

(73) Assignee: DIC CORPORATION, Tokyo (JP)

( * ) Notice: Subject to any disclaimer, the term of this patent is extended or adjusted under 35 U.S.C. 154(b) by 0 days.

(21) Appl. No.: 14/913,193

(22) PCT Filed: Sep. 11, 2014

(86) PCT No.: PCT/JP2014/074108
§ 371 (c)(1),
(2) Date: Feb. 19, 2016

(87) PCT Pub. No.: WO2015/041143
PCT Pub. Date: Mar. 26, 2015

(65) Prior Publication Data
US 2016/0177020 A1 Jun. 23, 2016

(30) Foreign Application Priority Data
Sep. 18, 2013 (JP) .................... 2013-192946

(51) Int. Cl.
G03F 7/039 (2006.01)
C08G 8/28 (2006.01)
C08G 8/36 (2006.01)
C09D 161/14 (2006.01)
C08L 61/14 (2006.01)
G03F 7/075 (2006.01)

(52) U.S. Cl.
CPC .............. *C08G 8/28* (2013.01); *C08G 8/36* (2013.01); *C08L 61/14* (2013.01); *C09D 161/14* (2013.01); *G03F 7/039* (2013.01); *G03F 7/0392* (2013.01); *G03F 7/0758* (2013.01)

(58) Field of Classification Search
None
See application file for complete search history.

(56) References Cited

U.S. PATENT DOCUMENTS

| 5,023,164 A * | 6/1991 | Brunsvold | G03F 7/039 430/270.1 |
| 5,837,419 A * | 11/1998 | Ushirogouchi | G03F 7/0045 430/170 |
| 2001/0018497 A1 | 8/2001 | Furihata et al. | |
| 2003/0134223 A1 | 7/2003 | Katano et al. | |

FOREIGN PATENT DOCUMENTS

| JP | 2001-220420 A | 8/2001 |
| JP | 2002-258482 A | 9/2002 |
| JP | 2003-98671 A | 4/2003 |
| JP | 2003-149816 A | 5/2003 |
| JP | 2004-115724 A | 4/2004 |
| JP | 2004-231858 A | 8/2004 |
| JP | 2009-223120 A | 10/2009 |
| JP | 2010-15112 A | 1/2010 |

(Continued)

OTHER PUBLICATIONS

English translation of JP, 2009-223120, A (2009) from machine translation from AIPN Japan Patent Office National Center for Industrial Property Information and Training, generated Jul. 1, 2016, 9 pages.*
English translation of JP, 2010-248435, A (2010) from machine translation from AIPN Japan Patent Office National Center for Industrial Property Information and Training, generated Jul. 1, 2016, 9 pages.*
English translation of JP, 2010-218107, A (2010) from machine translation from AIPN Japan Patent Office National Center for Industrial Property Information and Training, generated Jul. 1, 2016, 6 pages.*
English translation of JP, 2010-15112, A (2010) from machine translation from AIPN Japan Patent Office National Center for Industrial Property Information and Training, generated Jul. 1, 2016, 14 pages.*

(Continued)

*Primary Examiner* — Cynthia Hamilton
(74) *Attorney, Agent, or Firm* — Westerman, Hattori, Daniels & Adrian, LLP

(57) ABSTRACT

Provided is a modified hydroxy naphthalene novolak resin which is optimal for a photosensitive composition and a resist material having high optical sensitivity, resolution, and alkali developability, and excellent heat resistance and moisture absorption resistance, and the modified hydroxy naphthalene novolak resin includes a structural moiety (I) represented by Structural Formula as a repeating unit:

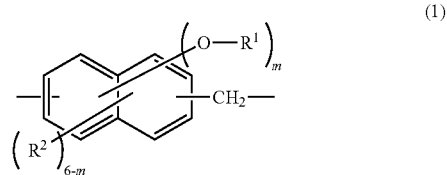

wherein $R^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group; m is 1 or 2; $R^2$'s each independently is any one of a hydrogen atom, an alkyl group, an alkoxy group, an aryl group, an aralkyl group, and a halogen atom; and at least one of the $R^1$'s present in the resin is any one of a tertiary alkyl group, an alkoxyalkyl group, an acyl group, an alkoxycarbonyl group, a hetero atom-containing cyclic hydrocarbon group, and a trialkylsilyl group.

8 Claims, 4 Drawing Sheets

(56) References Cited

FOREIGN PATENT DOCUMENTS

JP  2010-248407 A  11/2010
JP  2010-248435 A  11/2010

OTHER PUBLICATIONS

English translation of JP, 2004-231858, A (2004) from machine translation from AIPN Japan Patent Office National Center for Industrial Property Information and Training, generated Jul. 1, 2016, 16 pages.*
English translation of JP, 2004-115724, A (2004) from machine translation from AIPN Japan Patent Office National Center for Industrial Property Information and Training, generated Jul. 1, 2016, 13 pages.*
English translation of JP, 2002-258482, A (2002) from machine translation from AIPN Japan Patent Office National Center for Industrial Property Information and Training, generated Jul. 1, 2016, 9 pages.*
International Search Report dated Dec. 22, 2014, issued in counterpart application No. PCT/JP2014/074108 (2 pages).

* cited by examiner

MODIFIED HYDROXY NAPHTHALENE NOVOLAK RESIN, PRODUCTION METHOD FOR MODIFIED HYDROXY NAPHTHALENE NOVOLAK RESIN, PHOTOSENSITIVE COMPOSITION, RESIST MATERIAL AND COATING

TECHNICAL FIELD

The present invention relates to a modified hydroxy naphthalene novolak resin from which a coating having high optical sensitivity, resolution, and alkali developability, and excellent heat resistance and moisture absorption resistance can be obtained, and which is optimally used for a photosensitive composition and a resist material.

BACKGROUND ART

A phenolic hydroxy group-containing compound is not only used for an adhesive, a molding material, a coating material, a photoresist material, an epoxy resin raw material, or a curing agent for an epoxy resin, but is also widely used in the electric and/or electronic field such as a semiconductor sealing material or an insulating material for a printed circuit board, as a curable resin composition using the phenolic hydroxyl group-containing compound itself as a main agent, or as a curing agent of an epoxy resin, since a cured product has excellent heat resistance and moisture resistance.

Among these, as a resin material for a positive-type photoresist, a resin composition has been widely used, which is composed of a novolak type phenolic resin having excellent heat resistance and alkali solubility and a photosensitizer such as a naphthoquinone diazide compound. However, in recent years, as a circuit pattern has become more detailed, improvement of optical sensitivity and resolution is further required, and development of a new resin material for a photoresist is expected.

As the new photoresist material having excellent optical sensitivity and resolution, a chemically amplified photoresist has been highlighted. The chemically amplified photoresist is composed of a photoacid generator and a resin material whose alkali solubility is greatly changed under the condition of an acid catalyst, and in the case of a positive-type photoresist, a resin material, which changes from alkali-insoluble to alkali-soluble as a result of generation of an acid upon irradiation with light, is used. As the resin material for this chemically amplified photoresist, for example, a modified cresol novolak resin, in which an acid dissociable protective group is introduced to a part or the entirety of phenolic hydroxy groups of a cresol novolak type resin, is known (for example, refer to PTL 1). The chemically amplified photoresist material using the modified cresol novolak resin, and disclosed in PTL 1 has excellent optical sensitivity or resolution, compared to the conventional type photoresist material; however, the optical sensitivity and resolution are not sufficient in order to form a more detailed pattern, and as a result of modifying the phenolic hydroxy group, heat resistance or moisture absorption resistance of a coating is remarkably decreased.

CITATION LIST

Patent Literature

[PTL 1] JP-A-2009-223120

SUMMARY OF INVENTION

Technical Problem

Therefore, an object of the present invention is to provide a modified hydroxy naphthalene novolak resin from which a coating having high optical sensitivity, resolution, and alkali developability, and excellent heat resistance and moisture absorption resistance can be obtained, and which is optimally used for a photosensitive composition and a resist material; and a production method thereof.

Solution to Problem

As a result of conducting a thorough investigation in order to solve the aforementioned problem, the present inventors found that when a modified hydroxy naphthalene novolak resin, in which a part of hydrogen atoms of phenolic hydroxy groups in the hydroxy naphthalene novolak resin is substituted with any one of a tertiary alkyl group, an alkoxyalkyl group, an acyl group, an alkoxycarbonyl group, a hetero atom-containing cyclic hydrocarbon group, and a trialkylsilyl group, is mixed with a photoacid generator, a coating having high optical sensitivity, resolution, and alkali developability, and excellent heat resistance and moisture absorption resistance can be obtained; and the modified hydroxy naphthalene novolak resin is appropriate for a resin material for a chemically amplified type photoresist, thereby completing the invention.

In other words, the present invention is to provide a modified hydroxy naphthalene novolak resin including a structural moiety (I) represented by Structural Formula (1) as a repeating unit.

[Chem. 1]

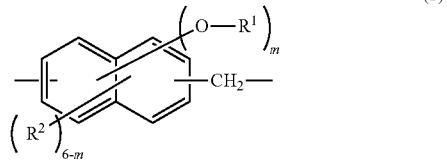

(1)

In Structural Formula (1), $R^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group, and m is 1 or 2. When m is 2, the two $R^1$'s may be the same as or different from each other. $R^2$'s each independently is any one of a hydrogen atom, an alkyl group, an alkoxy group, an aryl group, an aralkyl group, and a halogen atom.

At least one of the $R^1$'s present in the resin is any one of a tertiary alkyl group, an alkoxyalkyl group, an acyl group, an alkoxycarbonyl group, a hetero atom-containing cyclic hydrocarbon group, and a trialkylsilyl group.

Furthermore, the present invention is to provide a method for producing a modified hydroxy naphthalene novolak resin including: reacting a hydroxy naphthalene compound and formaldehyde in a mixed solvent of a hydrophobic organic solvent and water under the condition of an acid catalyst to obtain a hydroxy naphthalene novolak intermediate; and substituting a part of hydrogen atoms of phenolic hydroxy groups of the obtained hydroxy naphthalene novolak intermediate with any one of a tertiary alkyl group, an alkoxyalkyl group, an acyl group, an alkoxycarbonyl group, a hetero atom-containing cyclic hydrocarbon group, and a trialkylsilyl group.

Furthermore, the present invention is to provide a photosensitive composition including: the modified hydroxy naphthalene novolak resin; and a photoacid generator.

Furthermore, the present invention is to provide a resist material including the photosensitive composition.

Furthermore, the present invention is to provide a coating formed of the photosensitive composition.

Advantageous Effects of Invention

According to the present invention, it is possible to provide the modified hydroxy naphthalene novolak resin from which a coating having high optical sensitivity, resolution, and alkali developability, and excellent heat resistance and moisture absorption resistance can be obtained, and which is optimally used for a photosensitive composition and a resist material; and a production method thereof.

DESCRIPTION OF EMBODIMENTS

Figure 1:
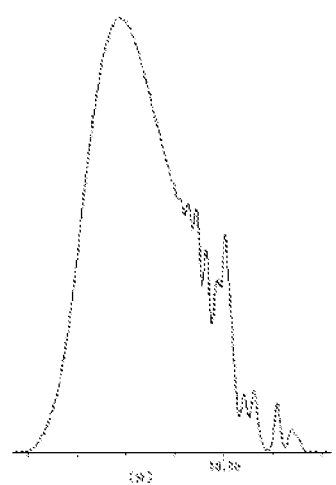
FIG. 1 is a GPC chart of a hydroxy naphthalene novolak intermediate (1) obtained in Preparation Example 1.

The modified hydroxy naphthalene novolak resin of the present invention includes a structural moiety (I) represented by Structural Formula (1) as a repeating unit.

[Chem. 2]

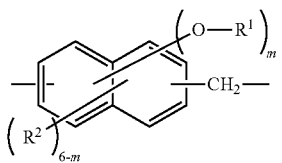
(1)

In Structural Formula (1), $R^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group, and m is 1 or 2. When m is 2, the two $R^1$'s may be the same as or different from each other. $R^2$'s each independently is any one of a hydrogen atom, an alkyl group, an alkoxy group, an aryl group, an aralkyl group, and a halogen atom.

At least one of $R^1$'s present in the resin is any one of a tertiary alkyl group, an alkoxyalkyl group, an acyl group, an alkoxycarbonyl group, a hetero atom-containing cyclic hydrocarbon group, and a trialkylsilyl group. Since the resin has the structural moiety (I), it is possible to obtain a coating having optical sensitivity, resolution, and alkali developability, which are difficult to obtain in the related art, and having heat resistance and moisture absorption resistance as well, and to obtain a modified hydroxy naphthalene novolak resin which can be particularly preferably used for a resist material.

The modified hydroxy naphthalene novolak resin of the present invention has, as described above, a structural moiety (I) as a repeating unit. Here, the modified hydroxy naphthalene novolak resin of the present invention may be a resin mixture containing a plurality of components having a different number of repeating units. Examples of the modified hydroxy naphthalene novolak resin of the present invention include the following resins.

A trimer or higher modified hydroxy naphthalene novolak resin represented by the following formula.

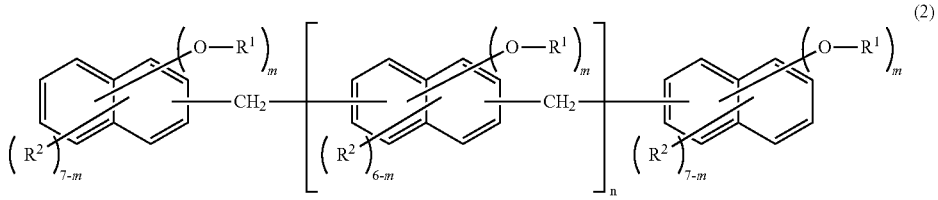
(2)

In the formula, $R^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group, at least one of a plurality of the $R^1$'s is any one of a tertiary alkyl group, an alkoxyalkyl group, an acyl group, an alkoxycarbonyl group, a hetero atom-containing cyclic hydrocarbon group, and a trialkylsilyl group, and m is 1 or 2. When m is 2, the two $R^1$'s may be the same as or different from each other. $R^2$'s each independently is any one of a hydrogen atom, an alkyl group, an alkoxy group, an aryl group, an aralkyl group, and a halogen atom. n is an integer of 1 or more.

A modified hydroxy naphthalene novolak resin, which is a dimaer, represented by Structural Formula (3) shown below.

[Chem. 4]

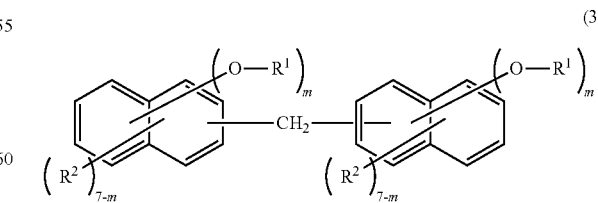
(3)

In the formula, $R^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group, at least one of a plurality of the $R^1$'s is any one of a tertiary alkyl group, an alkoxyalkyl group, an acyl group, an alkoxycarbonyl group, a hetero atom-containing cyclic hydrocarbon group, and a trialkylsilyl group, and m is 1 or 2. When m is 2, the two $R^1$'s may be the same as or different from each other. $R^2$'s each independently is any one of a hydrogen atom, an alkyl group, an alkoxy group, an aryl group, an aralkyl group, and a halogen atom.

n in the modified hydroxy naphthalene novolak resin represented by General Formula (2) shown above is preferably an integer of 1 to 130, and more preferably an integer of 3 to 50, in order to obtain a resist material having excellent coating formation properties. n is preferably an integer of 4 to 20, in order to obtain a resist material having excellent followability to a detailed pattern, in addition to the coating formation properties. Here, the n is an average number calculated from the number average molecular weight (Mn) which is calculated from the GPC measurement condition described below.

The modified hydroxy naphthalene novolak resin of the present invention may contain a hydroxy naphthalene novolak resin, which is a dimer, represented by the following formula.

[Chem. 5]

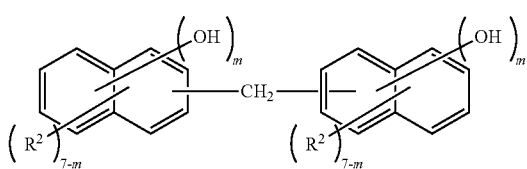

(3'-1)

In the formula, $R^2$'s each independently is any one of a hydrogen atom, an alkyl group, an alkoxy group, an aryl group, an aralkyl group, and a halogen atom, and m is 1 or 2. When m is 2, the two $R^1$'s may be the same as or different from each other.

The total content of a dimer component represented by the (3) or (3'-1) in the modified hydroxy naphthalene novolak resin of the present invention is preferably 5% by mass or less and more preferably 3% by mass or less, in order to be a resin having excellent resolution and heat resistance.

In addition, the modified hydroxy naphthalene novolak resin of the present invention may contain a monomer component represented by Structural Formula (3) shown below.

[Chem. 6]

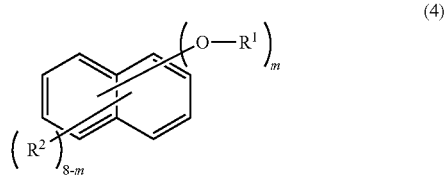

(4)

In the formula, $R^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group, and m is 1 or 2. When m is 2, the two $R^1$'s may be the same as or different from each other. $R^2$'s each independently is any one of a hydrogen atom, an alkyl group, an alkoxy group, an aryl group, an aralkyl group, and a halogen atom.

The total content of the monomer component represented by the above (4) in the modified hydroxy naphthalene novolak resin of the present invention is preferably 2% by mass or less and more preferably 1% by mass or less, in order to be a resin having excellent resolution and heat resistance.

Here, the content of the dimer component and the monomer component in the resin is a value calculated from an area ratio of a GPC chart measured under the following conditions, and specifically, an existence ratio of a peak area of each component with respect to the entire area of the GPC chart of the modified hydroxy naphthalene novolak resin of the present invention.

<GPC Measurement Conditions>

Measuring apparatus: "HLC-8220 GPC" manufactured by TOSOH CORPORATION (8.0 mm I.D.×300 mm)

Column: "Shodex KF802" manufactured by SHOWA DENKO K.K. (8.0 mm I.D.×300 mm)+"Shodex KF802" manufactured by SHOWA DENKO K.K. (8.0 mm I.D.×300 mm)+"Shodex KF803" manufactured by SHOWA DENKO K.K. (8.0 mm I.D.×300 mm)+"Shodex KF804" manufactured by SHOWA DENKO K.K. (8.0 mm I.D.×300 mm)

Detector: RI (differential refractometer)

Data processing: "GPC-8020 model II data analysis version 4.30" manufactured by TOSOH CORPORATION Measurement Conditions:

Column temperature 40° C.

Eluent Tetrahydrofuran (THF)

Flow rate 1.0 ml/minutes

Sample: A substance obtained by filtrating 1.0% by mass (in terms of a resin solid content) of a tetrahydrofuran solution with a micro filter (5 µl).

Standard sample: according to the measurement manual of the "GPC-8020 model II data analysis version 4.30", the following monodispersed polystyrene whose molecular weight is known is used.

(Monodispersed Polystyrene)

"A-500" manufactured by TOSOH CORPORATION
"A-2500" manufactured by TOSOH CORPORATION
"A-5000" manufactured by TOSOH CORPORATION
"F-1" manufactured by TOSOH CORPORATION
"F-2" manufactured by TOSOH CORPORATION
"F-4" manufactured by TOSOH CORPORATION
"F-10" manufactured by TOSOH CORPORATION
"F-20" manufactured by TOSOH CORPORATION The modified hydroxy naphthalene novolak resin of the present invention has the structural moiety (I) as a repeating unit. In addition, with respect to a structural moiety represented by —O—$R^1$ in Structural Formula (1) in the resin, at least one of $R^1$'s is any one of a tertiary alkyl group, an alkoxyalkyl group, an acyl group, an alkoxycarbonyl group, a hetero atom-containing cyclic hydrocarbon group, and a trialkylsilyl group. An existence ratio [(OX)/(OH)] of the structural moiety (OX), in which $R^1$ is any one of a tertiary alkyl group, an alkoxyalkyl group, an acyl group, an alkoxycarbonyl group, a hetero atom-containing cyclic hydrocarbon group, and a trialkylsilyl group, to the structural moiety (OH), in which $R^1$ is a hydrogen atom, is preferably in a range of 5/95 to 50/50 and more preferably in a range of 10/90 to 40/60, in order to be a resin having high optical sensitivity, resolution, and alkali developability, and excellent heat resistance and moisture absorption resistance.

Here, the existence ratio of the structural moiety (OX), in which $R^1$ is any one of a tertiary alkyl group, an alkoxyalkyl group, an acyl group, an alkoxycarbonyl group, a hetero atom-containing cyclic hydrocarbon group, and a trialkylsilyl group, to the structural moiety (OH), in which $R^1$ is a hydrogen atom, is a value calculated from a ratio of the peak of 145 ppm to 160 ppm derived from a carbon atom on a benzene ring where the phenolic hydroxy group is bonded, in other words, the structural moiety (OH), in which $R^1$ is a hydrogen atom, to the peak of 95 ppm to 105 ppm derived from a carbon atom in $R^1$ where an oxygen atom derived from the phenolic hydroxy group is bonded, in the structural unit (OX), in which $R^1$ is any one of a tertiary alkyl group, an alkoxyalkyl group, an acyl group, an alkoxycarbonyl group, a hetero atom-containing cyclic hydrocarbon group, and a trialkylsilyl group, in the 13C-NMR measurement measured under the following conditions.

Apparatus: "JNM-LA300" manufactured by JEOL Ltd.
Solvent: DMSO-$d_6$

In Structural Formulas (1) to (4), the structural moiety (OX), in which $R^1$ is any one of a tertiary alkyl group, an alkoxyalkyl group, an acyl group, an alkoxycarbonyl group, a hetero atom-containing cyclic hydrocarbon group, and a trialkylsilyl group, is cleaved under the condition of an acid catalyst, and produces the phenolic hydroxy group, and all of the $R^1$'s in the resin may have the same structure or a different structure respectively.

Examples of the tertiary alkyl group include a t-butyl group and a t-pentyl group. Examples of the alkoxyalkyl group include a methoxyethyl group, an ethoxyethyl group, a propoxyethyl group, a butoxyethyl group, a cyclohexyloxyethyl group, and a phenoxyethyl group. Examples of the acyl group include an acetyl group, an ethanoyl group, a propanoyl group, a butanoyl group, a cyclohexanecarbonyl group, and a benzoyl group. Examples of the alkoxycarbonyl group include a methoxycarbonyl group, an ethoxycarbonyl group, a propoxycarbonyl group, a butoxycarbonyl group, a cyclohexyloxycarbonyl group, and a phenoxycarbonyl group. Examples of the hetero atom-containing cyclic hydrocarbon group include a tetrahydrofuranyl group and a tetrahydropyranyl group. Examples of the trialkylsilyl group include a trimethylsilyl group, a triethylsilyl group, and a t-butyldimethylsilyl group.

Among these, in order to be a resin in which cleavage easily progresses under the condition of an acid catalyst, and from which a coating having excellent optical sensitivity, resolution, and alkali developability can be obtained, any one of an alkoxyalkyl group, an alkoxycarbonyl group, and a hetero atom-containing cyclic hydrocarbon group is preferable, and any one of an ethoxyethyl group, a butoxycarbonyl group, and a tetrahydropyranyl group is preferable.

$R^2$'s in Structural Formulas (1) to (4), and (3'-1) each independently is any one of a hydrogen atom, an alkyl group, an alkoxy group, an aryl group, an aralkyl group, and a halogen atom. Examples of the alkyl group include a methyl group, an ethyl group, a propyl group, a butyl group, a pentyl group, a hexyl group, and a cyclohexyl group. Examples of the alkoxy group include a methoxy group, an ethoxy group, a propyloxy group, a butoxy group, a pentyloxy group, a hexyloxy group, and a cyclohexyloxy group. Examples of the aryl group include a phenyl group, a hydroxyphenyl group, a dihydroxyphenyl group, a hydroxyalkoxyphenyl group, an alkoxyphenyl group, a tolyl group, a xylyl group, a naphthyl group, a hydroxynaphthyl group, and a dihydroxynaphthyl group. Examples of the aralkyl group include a phenylmethyl group, a hydroxyphenylmethyl group, a dihydroxyphenylmethyl group, a tolylmethyl group, a xylylmethyl group, a naphthylmethyl group, a hydroxynaphthylmethyl group, a dihydroxynaphthylmethyl group, a phenylethyl group, a hydroxyphenylethyl group, a dihydroxyphenylethyl group, a tolylethyl group, a xylylethyl group, a naphthylethyl group, a hydroxynaphthylethyl group, and a dihydroxynaphthylethyl group. Examples of the halogen atom include a fluorine atom, a chlorine atom, and a bromine atom.

Among these, in order to be a resin from which a coating having excellent heat resistance and moisture absorption resistance can be obtained, all of the $R^2$'s are preferably a hydrogen atom or an alkyl group, and more preferably a hydrogen atom.

A value of m in Structural Formulas (1) to (4) is 1 or 2, and a substitution position of the structural moiety represented by —O—$R^1$ on a naphthylene skeleton is arbitrary. Among these, in order to be a resin from which a coating having excellent resolution and heat resistance can be obtained, in the case where m is 1, the substitution position of the structural moiety represented by —O—$R^1$ is preferably 1-position, and in the case where m is 2, the substitution positions of the structural moieties represented by —O—$R^1$ are preferably 2-position and 7-position.

Therefore, the structural moiety (I) represented by Structural Formula (1) is more preferably a structural unit (I-1) or (I-2) represented by Structural Formula (1-1) or (1-2) shown below.

[Chem. 7]

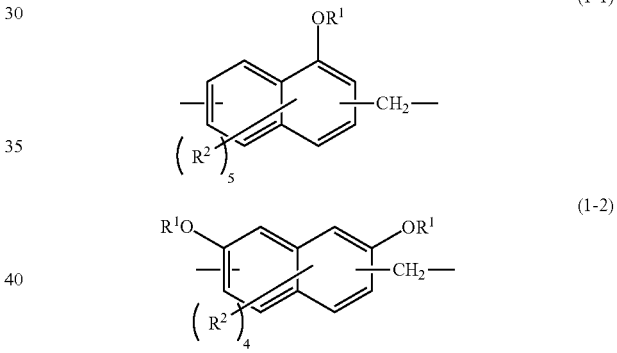

In the formulas, $R^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group, and $R^2$'s each independently is any one of a hydrogen atom, an alkyl group, an alkoxy group, an aryl group, an aralkyl group, and a halogen atom.

A weight average molecular weight (Mw) of the modified hydroxy naphthalene novolak resin of the present invention is preferably in a range of 1,000 to 8,000, in order to be a resin from which a coating having high resolution and excellent heat resistance and moisture absorption resistance can be obtained. In addition, a value of polydispersity (Mw/Mn) is preferably in a range of 1.2 to 2.3, in order to be a resin from which a coating having high resolution and excellent heat resistance and moisture absorption resistance can be obtained.

In addition, the weight average molecular weight (Mw) and polydispersity (Mw/Mn) of the present invention are values measured by GPC under the following conditions.

<GPC Measurement Conditions>

Measuring apparatus: "HLC-8220 GPC" manufactured by TOSOH CORPORATION (8.0 mm I.D.×300 mm)

Column: "Shodex KF802" manufactured by SHOWA DENKO K.K. (8.0 mm I.D.×300 mm)+"Shodex KF802" manufactured by SHOWA DENKO K.K. (8.0 mm I.D.×300 mm)+"Shodex KF803" manufactured by SHOWA DENKO K.K. (8.0 mm I.D.×300 mm)+"Shodex KF804" manufactured by SHOWA DENKO K.K. (8.0 mm I.D.×300 mm)

Detector: RI (differential refractometer)

Data processing: "GPC-8020 model II data analysis version 4.30" manufactured by TOSOH CORPORATION Measurement Conditions:
Column temperature 40° C.
Eluent tetrahydrofuran (THF)
Flow rate 1.0 ml/minutes
Sample: A substance obtained by filtrating 1.0% by mass (in terms of a resin solid content) of a tetrahydrofuran solution with a micro filter (5 µl).

Standard sample: according to the measurement manual of the "GPC-8020 model II data analysis version 4.30", the following monodispersed polystyrene whose molecular weight is known is used.

(Monodispersed Polystyrene)
"A-500" manufactured by TOSOH CORPORATION
"A-2500" manufactured by TOSOH CORPORATION
"A-5000" manufactured by TOSOH CORPORATION
"F-1" manufactured by TOSOH CORPORATION
"F-2" manufactured by TOSOH CORPORATION
"F-4" manufactured by TOSOH CORPORATION
"F-10" manufactured by TOSOH CORPORATION
"F-20" manufactured by TOSOH CORPORATION The modified hydroxy naphthalene novolak resin of the present invention can be produced by, for example, reacting a hydroxy naphthalene compound and formaldehyde in a mixed solvent of a hydrophobic organic solvent and water under the condition of an acid catalyst to obtain a hydroxy naphthalene novolak resin (hereinafter, may be referred to as a hydroxy naphthalene novolak intermediate); and substituting a part of hydrogen atoms of phenolic hydroxy groups of the obtained hydroxy naphthalene novolak intermediate with any one of a tertiary alkyl group, an alkoxyalkyl group, an acyl group, an alkoxycarbonyl group, a hetero atom-containing cyclic hydrocarbon group and a trialkylsilyl group.

Examples of the hydroxy naphthalene compound used in the production method include 1-naphthol, 2-naphthol, 1,4-dihydroxynaphthalene, 1,5-dihydroxynaphthalene, 1,6-dihydroxynaphthalene, 2,6-dihydroxynaphthalene, 2,7-dihydroxynaphthalene, and a compound in which nuclei of these compounds are substituted with one or a plurality of an alkyl group, an alkoxy group, an aryl group, an aralkyl group, or a halogen atom. Each of these compounds may be used alone, or two or more thereof may be used in combination. Among the hydroxy naphthalene compounds, 1-naphthol or 2,7-dihydroxynaphthalene is preferable, in order to be a resin from which a coating having excellent resolution and heat resistance can be obtained.

The formaldehyde used in the production method may be either formalin in a state of an aqueous solution or paraformaldehyde in a state of a solid.

As a reaction ratio of the hydroxy naphthalene compound to formaldehyde, the hydroxy naphthalene compound is preferably in a range of 0.5 moles to 1.5 moles with respect to 1 mole of formaldehyde, in order to be a resin from which a coating having excellent resolution and heat resistance can be obtained.

Examples of the acid catalyst used in the production method include inorganic acids such as hydrochloric acid, sulfuric acid, and phosphoric acid, organic acids such as methanesulfonic acid, p-toluenesulfonic acid, and oxalic acid, and Lewis acids such as boron trifluoride, anhydrous aluminium chloride, and zinc chloride. Each of these may be used alone, or two or more thereof may be used in combination. Among these, paratoluenesulfonic acid is preferable, in order to have a high reaction promoting ability. In addition, the use amount of the acid catalyst is preferably in a range of 0.01 parts by mass to 5 parts by mass with respect to 100 parts by mass of the hydroxy naphthalene compound, in order to progress the reaction effectively.

In the production method, since the reaction of the hydroxy naphthalene compound and formaldehyde is performed in a mixed solvent of a hydrophobic organic solvent and water, it is possible to preferably obtain a resin from which a coating having excellent resolution and heat resistance can be obtained. The hydrophobic organic solvent used herein is not particularly limited, if the solvent becomes non-uniform when mixed with water. The specific examples thereof include a ketone compound such as methylethylketone and methylisobutylketone, an alcohol compound having 4 or more carbon atoms such as butanol and octanol, and an aromatic compound such as benzene, toluene, and xylene.

In the production method, as the ratio of water to hydrophobic organic solvent, the hydrophobic organic solvent is preferably 50 parts by mass to 1,000 parts by mass with respect to 100 parts by mass of water, and more preferably 200 parts by mass to 600 parts by mass with respect to 100 parts by mass of water, in order to be a resin in which the reaction progresses effectively, and from which a coating having excellent resolution and heat resistance can be obtained.

In addition, the reaction of the hydroxy naphthalene compound and formaldehyde is preferably performed within a temperature range of 60° C. to 90° C., in order to progress the reaction effectively.

After the reaction is completed, an organic phase and an aqueous phase are separated, and then the organic phase is washed with water. An organic phase is heated under the condition of reduced pressure to remove the solvent, thereby obtaining a hydroxy naphthalene novolak intermediate.

In the hydroxy naphthalene novolak intermediate obtained as the above, the weight average molecular weight (Mn) thereof is preferably in a range of 1,000 to 5,000, and polydispersity (Mw/Mn) thereof is preferably in a range of 1.2 to 2.1, in order to easily adjust the weight average molecular weight (Mn) and polydispersity (Mw/Mn) of the modified hydroxy naphthalene novolak resin to be obtained ultimately to values within the preferable range.

Subsequently, as a method for substituting a part of hydrogen atoms of phenolic hydroxy groups of the obtained hydroxy naphthalene novolak intermediate with any one of a tertiary alkyl group, an alkoxyalkyl group, an acyl group, an alkoxycarbonyl group, a hetero atom-containing cyclic hydrocarbon group, and a trialkylsilyl group, specifically, a method for reacting the hydroxy naphthalene novolak intermediate with a compound (hereinafter, shortly referred to as a "protective group-introducing agent") represented by any one of Structural Formulas (5-1) to (5-8) shown below can be exemplified.

[Chem. 8]

(5-1)

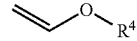

(5-2)

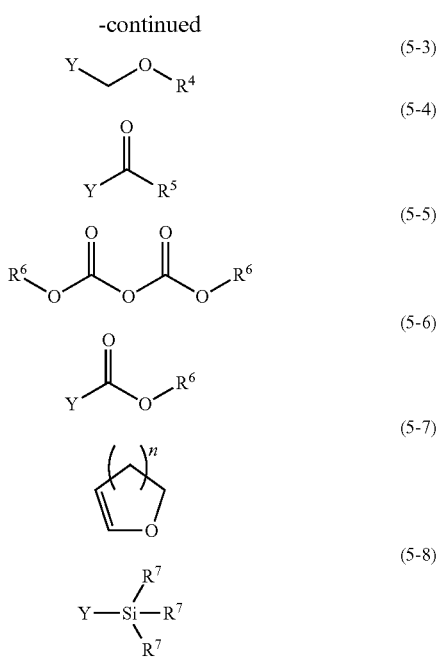

In the formulas, Y represents a halogen atom, $R^3$ to $R^7$ each independently represent an alkyl group having 1 to 6 carbon atoms or a phenyl group. In addition, n is 1 or 2.

Among the protective group-introducing agents, in order to be a resin in which cleavage easily progresses under the condition of an acid catalyst, and which has excellent optical sensitivity, resolution, and alkali developability, the compound represented by Structural Formula (5-2), (5-5), or (5-7) is preferable, and ethylvinylether, di-t-butyl dicarbonate, or dihydropyran is particularly preferable.

A method for reacting the hydroxy naphthalene novolak intermediate with the protective group-introducing agent represented by any one of Structural Formulas (5-1) to (5-8) is different depending on which compound to be used as the protective group-introducing agent, and in the case where a compound represented by any one of Structural Formulas (5-1), (5-3), (5-4), (5-5), (5-6), and (5-8) is used as the protective group-introducing agent, a method for reacting the hydroxy naphthalene novolak intermediate with the protective group-introducing agent under the condition of a basic catalyst such as pyridine and triethylamine can be exemplified. In addition, in the case where a compound represented by Structural Formula (5-2) or (5-7) is used as the protective group-introducing agent, a method for reacting the hydroxy naphthalene novolak intermediate with the protective group-introducing agent under the condition of an acidic catalyst such as hydrochloric acid can be exemplified.

A reaction ratio of the hydroxy naphthalene novolak intermediate and the protective group-introducing agent represented by any one of Structural Formulas (5-1) to (5-8) is different depending on which compound to be used as the protective group-introducing agent. However, with respect to the structural moiety represented by —O—$R^1$ present in the obtained modified hydroxy naphthalene novolak resin (where $R^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group), it is preferable to perform the reaction such that an existence ratio [(OX)/(OH)] of the structural moiety (Ox), in which $R^1$ is any one of a tertiary alkyl group, an alkoxyalkyl group, an acyl group, an alkoxycarbonyl group, a hetero atom-containing cyclic hydrocarbon group, and a trialkylsilyl group, to the structural moiety (OH), in which $R^1$ is a hydrogen atom, is within a range of 5/95 to 50/50. That is, it is preferable to perform the reaction such that the ratio of the protective group-introducing agent is from 0.1 moles to 0.75 moles with respect to 1 mole of the phenolic hydroxy group of the hydroxy naphthalene novolak intermediate, and more preferable to perform the reaction such that the ratio of the protective group-introducing agent is 0.15 moles to 0.5 moles.

The reaction of the hydroxy naphthalene novolak intermediate and the protective group-introducing agent may be performed in an organic solvent. As the organic solvent used herein, 1,3-dioxolane, or the like can be exemplified. Each of these organic solvents may be used alone, or two or more thereof may be used as a mixed solvent.

After the reaction is completed, a reaction mixture is poured into ion exchanged water, and a precipitate is dried under reduced pressure, thereby obtaining the aimed modified hydroxy naphthalene novolak resin.

The photosensitive composition of the present invention contains the modified hydroxy naphthalene novolak resin and a photoacid generator as an essential component.

Examples of the photoacid generator used in the present invention include an organic halogen compound, sulfonate, an onium salt, a diazonium salt, and a disulfone compound, each of these may be used alone, and two or more thereof may be used in combination. The specific examples of these include a haloalkyl group-containing s-triazine derivative such as tris(trichloromethyl)-s-triazine, tris(tribromomethyl)-s-triazine, tris(dibromomethyl)-s-triazine, and 2,4-bis(tribromomethyl)-6-p-methoxyphenyl-s-triazine;

a halogen substituted paraffin-based hydrocarbon compound such as 1,2,3,4-tetrabromobutane, 1,1,2,2-tetrabromoethane, carbon tetrabromide, and iodoform; a halogen substituted cycloparaffin-based hydrocarbon compound such as hexabromocyclohexane, hexachlorocyclohexane, and hexabromocyclododecane;

a haloalkyl group-containing benzene derivative such as bis(trichloromethyl)benzene and bis(tribromomethyl)benzene; a haloalkyl group-containing sulfone compound such as tribromomethyl phenyl sulfone and trichloromethyl phenyl sulfone; a halogen-containing sulfolane compound such as 2,3-dibromosulfolane; a haloalkyl group-containing isocyanurate compound such as tris(2,3-dibromopropyl)isocyanurate;

a sulfonium salt such as triphenyl sulfonium chloride, triphenyl sulfonium methane sulfonate, triphenyl sulfonium trifluoromethane sulfonate, triphenyl sulfonium p-toluene sulfonate, triphenyl sulfonium tetrafluoroborate, triphenyl sulfonium hexafluoroarsenate, and triphenyl sulfonium hexafluorophosphonate;

an iodonium salt such as diphenyl iodonium trifluoromethane sulfonate, diphenyl iodonium p-toluene sulfonate, diphenyl iodonium tetrafluoroborate, diphenyl iodonium hexafluoroarsenate, and diphenyl iodonium hexafluorophosphonate;

a sulfonate compound such as p-toluene sulfonic acid methyl, p-toluene sulfonic acid ethyl, p-toluene sulfonic acid butyl, p-toluene sulfonic acid phenyl, 1,2,3-tris(p-toluene sulfonyloxy)benzene, p-toluene sulfonic acid benzoin ester, methane sulfonic acid methyl, methane sulfonic acid ethyl, methane sulfonic acid butyl, 1,2,3-tris(methane sulfonyloxy)benzene, methane sulfonic acid phenyl, methane sulfonic acid benzoin ester, trifluoromethane sulfonic acid methyl, trifluoromethane sulfonic acid ethyl, trifluoromethane sulfonic acid butyl, 1,2,3-tris(trifluoromethane sulfonyloxy)benzene, trifluoromethane sulfonic acid phenyl, and trifluoromethane sulfonic acid benzoin ester; a disulfone compound such as diphenyl disulfone;

a sulfone diazide compound such as bis(phenyl sulfonyl) diazomethane, bis(2,4-dimethyl phenyl sulfonyl)diazomethane, bis(cyclohexyl sulfonyl)diazomethane, cyclohexyl sulfonyl-(2-methoxyphenyl sulfonyl)diazomethane, cyclohexyl sulfonyl-(3-methoxyphenyl sulfonyl)diazomethane, cyclohexyl sulfonyl-(4-methoxyphenyl sulfonyl)diazomethane, cyclopentyl sulfonyl-(2-methoxyphenyl sulfonyl)diazomethane, cyclopentyl sulfonyl-(3-methoxyphenyl sulfonyl)diazomethane, cyclopentyl sulfonyl-(4-methoxyphenyl sulfonyl)diazomethane, cyclohexyl sulfonyl-(2-fluorophenyl sulfonyl)diazomethane, cyclohexyl sulfonyl-(3-fluorophenyl sulfonyl)diazomethane, cyclohexyl sulfonyl-(4-fluorophenyl sulfonyl)diazomethane, cyclopentyl sulfonyl-(2-fluorophenyl sulfonyl)diazomethane, cyclopentyl sulfonyl-(3-fluorophenyl sulfonyl)diazomethane, cyclopentyl sulfonyl-(4-fluorophenyl sulfonyl)diazomethane, cyclohexyl sulfonyl-(2-chlorophenyl sulfonyl)diazomethane, cyclohexyl sulfonyl-(3-chlorophenyl sulfonyl)diazomethane, cyclohexyl sulfonyl-(4-chlorophenyl sulfonyl)diazomethane, cyclopentyl sulfonyl-(2-chlorophenyl sulfonyl) diazomethane, cyclopentyl sulfonyl-(3-chlorophenyl sulfonyl)diazomethane, cyclopentyl sulfonyl-(4-chlorophenyl sulfonyl)diazomethane, cyclohexyl sulfonyl-(2-trifluoromethyl phenyl sulfonyl)diazomethane, cyclohexyl sulfonyl-(3-trifluoromethyl phenyl sulfonyl)diazomethane, cyclohexyl sulfonyl-(4-trifluoromethyl phenyl sulfonyl)diazomethane, cyclopentyl sulfonyl-(2-trifluoromethyl phenyl sulfonyl)diazomethane, cyclopentyl sulfonyl-(3-trifluoromethyl phenyl sulfonyl)diazomethane, cyclopentyl sulfonyl-(4-trifluoromethyl phenyl sulfonyl)diazomethane, cyclohexyl sulfonyl-(2-trifluoromethoxy phenyl sulfonyl) diazomethane, cyclohexyl sulfonyl-(3-trifluoromethoxy phenyl sulfonyl)diazomethane, cyclohexyl sulfonyl-(4-trifluoromethoxy phenyl sulfonyl)diazomethane, cyclopentyl sulfonyl-(2-trifluoromethoxy phenyl sulfonyl)diazomethane, cyclopentyl sulfonyl-(3-trifluoromethoxy phenyl sulfonyl)diazomethane, cyclopentyl sulfonyl-(4-trifluoromethoxy phenyl sulfonyl)diazomethane, cyclohexyl sulfonyl-(2,4,6-trimethyl phenyl sulfonyl)diazomethane, cyclohexyl sulfonyl-(2,3,4-trimethyl phenyl sulfonyl)diazomethane, cyclohexyl sulfonyl-(2,4,6-triethyl phenyl sulfonyl)diazomethane, cyclohexyl sulfonyl-(2,3,4-triethyl phenyl sulfonyl)diazomethane, cyclopentyl sulfonyl-(2,4,6-trimethyl phenyl sulfonyl)diazomethane, cyclopentyl sulfonyl-(2,3,4-trimethyl phenyl sulfonyl)diazomethane, cyclopentyl sulfonyl-(2,4,6-triethyl phenyl sulfonyl)diazomethane, cyclopentyl sulfonyl-(2,3,4-triethyl phenyl sulfonyl)diazomethane, phenyl sulfonyl-(2-methoxyphenyl sulfonyl)diazomethane, phenyl sulfonyl-(3-methoxyphenyl sulfonyl)diazomethane, phenyl sulfonyl-(4-methoxyphenyl sulfonyl)diazomethane, bis(2-methoxyphenyl sulfonyl)diazomethane, bis(3-methoxyphenyl sulfonyl)diazomethane, bis(4-methoxyphenyl sulfonyl)diazomethane, phenyl sulfonyl-(2,4,6-trimethyl phenyl sulfonyl)diazomethane, phenyl sulfonyl-(2,3,4-trimethyl phenyl sulfonyl)diazomethane, phenyl sulfonyl-(2,4,6-triethyl phenyl sulfonyl)diazomethane, phenyl sulfonyl-(2,3,4-triethyl phenyl sulfonyl)diazomethane, 2,4-dimethyl phenyl sulfonyl-(2,4,6-trimethyl phenyl sulfonyl)diazomethane, 2,4-dimethyl phenyl sulfonyl-(2,3,4-trimethyl phenyl sulfonyl)diazomethane, phenyl sulfonyl-(2-fluorophenyl sulfonyl)diazomethane, phenyl sulfonyl-(3-fluorophenyl sulfonyl)diazomethane, and phenyl sulfonyl-(4-fluorophenyl sulfonyl)diazomethane;

an o-nitrobenzyl ester compound such as o-nitrobenzyl-p-toluene sulfonate; and a sulfone hydrazide compound such as N,N'-di(phenyl sulfonyl)hydrazide.

An addition amount of the photoacid generator is preferably in a range of 0.1 parts by mass to 20 parts by mass with respect to 100 parts by mass of the modified hydroxy naphthalene novolak resin of the present invention, in order to be a photosensitive composition having high optical sensitivity.

The photosensitive composition of the present invention may contain an organic basic compound in order to neutralize an acid generated from the photoacid generator upon light exposure. The addition of the organic basic compound has an effect of preventing a dimension change of a resist pattern caused by movement of the acid generated from the photoacid generator. Examples of the organic basic compound used herein include organic amine compounds selected from nitrogen-containing compounds, and the specific examples thereof include a pyrimidine compound such as pyrimidine, 2-aminopyrimidine, 4-aminopyrimidine, 5-aminopyrimidine, 2,4-diaminopyrimidine, 2,5-diaminopyrimidine, 4,5-diaminopyrimidine, 4,6-diaminopyrimidine, 2,4,5-triaminopyrimidine, 2,4,6-triaminopyrimidine, 4,5,6-triaminopyrimidine, 2,4,5,6-tetraaminopyrimidine, 2-hydroxypyrimidine, 4-hydroxypyrimidine, 5-hydroxypyrimidine, 2,4-dihydroxypyrimidine, 2,5-dihydroxypyrimidine, 4,5-dihydroxypyrimidine, 4,6-dihydroxypyrimidine, 2,4,5-trihydroxypyrimidine, 2,4,6-trihydroxypyrimidine, 4,5,6-trihydroxypyrimidine, 2,4,5,6-tetrahydroxypyrimidine, 2-amino-4-hydroxypyrimidine, 2-amino-5-hydroxypyrimidine, 2-amino-4,5-dihydroxypyrimidine, 2-amino-4,6-dihydroxypyrimidine, 4-amino-2,5-dihydroxypyrimidine, 4-amino-2,6-dihydroxypyrimidine, 2-amino-4-methylpyrimidine, 2-amino-5-methylpyrimidine, 2-amino-4,5-dimethylpyrimidine, 2-amino-4,6-dimethylpyrimidine, 4-amino-2,5-dimethylpyrimidine, 4-amino-2,6-dimethylpyrimidine, 2-amino-4-methoxypyrimidine, 2-amino-5-methoxypyrimidine, 2-amino-4,5-dimethoxypyrimidine, 2-amino-4,6-dimethoxypyrimidine, 4-amino-2,5-dimethoxypyrimidine, 4-amino-2,6-dimethoxypyrimidine, 2-hydroxy-4-methylpyrimidine, 2-hydroxy-5-methylpyrimidine, 2-hydroxy-4,5-dimethylpyrimidine, 2-hydroxy-4,6-dimethylpyrimidine, 4-hydroxy-2,5-dimethylpyrimidine, 4-hydroxy-2,6-dimethylpyrimidine, 2-hydroxy-4-methoxypyrimidine, 2-hydroxy-4-methoxypyrimidine, 2-hydroxy-5-methoxypyrimidine, 2-hydroxy-4,5-dimethoxypyrimidine, 2-hydroxy-4,6-dimethoxypyrimidine, 4-hydroxy-2,5-dimethoxypyrimidine, and 4-hydroxy-2,6-dimethoxypyrimidine;

a pyridine compound such as pyridine, 4-dimethyl aminopyridine and 2,6-dimethyl pyridine;

an amine compound substituted with a hydroxyalkyl group having 1 to 4 carbon atoms such as diethanolamine, triethanolamine, triisopropanolamine, tris(hydroxymethyl) aminomethane, and bis(2-hydroxyethyl)iminotris(hydroxymethyl)methane; and an aminophenol compound such as 2-aminophenol, 3-aminophenol, and 4-aminophenol. Each of these may be used alone, or two or more thereof may be used in combination. Among these, the pyrimidine compound, the pyridine compound, or the amine compound having a hydroxy group is preferable, and an amine compound having a hydroxy group is particularly preferable, in order to be the resist pattern having excellent dimension stability after light exposure.

In the case where the organic basic compound is added, the addition amount thereof is preferably in a range of 0.1 mole % to 100 mole %, and more preferably in a range of 1 mole % to 50 mole %, with respect to the content of the photoacid generator.

In the photosensitive composition of the present invention, in addition to the modified hydroxy naphthalene novolak resin of the present invention, other alkali-soluble resins may be used in combination. As the other alkali-soluble resins, any resin can be used, if the resin itself can be dissolved in an alkali developing solution, or the resin is dissolved in an alkali developing solution by using the resin in combination with an additive such as a photoacid generator, in the same manner as the modified hydroxy naphthalene novolak resin of the present invention.

Examples of the other alkali-soluble resins used herein include a phenolic hydroxy group-containing resin other than the modified hydroxy naphthalene novolak resin, a homopolymer or a copolymer of a styrene compound containing a hydroxy group such as p-hydroxystyrene and p-(1,1,1,3,3,3-hexafluoro-2-hydroxypropyl)styrene, a resin in which these hydroxy groups are modified with an acid decomposable group such as a carbonyl group and a benzyloxycarbonyl group in the same manner as the modified hydroxy naphthalene novolak resin of the present invention, a homopolymer or a copolymer of (meth)acrylic acid, and an alternating polymer of an alicyclic polymerizable monomer such as a norbornene compound and a tetracyclododecene compound, and maleic anhydride or maleimide.

Examples of the phenolic hydroxy group-containing resin other than the modified hydroxy naphthalene novolak resin include phenol resins such as a phenol novolak resin, a cresol novolak resin, a naphthol novolak resin, a co-condensed novolak resin using various phenolic compounds, an aromatic hydrocarbon formaldehyde resin-modified phenolic resin, a dicyclopentadiene phenol adduct type resin, a phenol aralkyl resin (Xylok resin), a naphthol aralkyl resin, a trimethylol methane resin, a tetraphenylol ethane resin, a biphenyl-modified phenolic resin (a polyvalent phenolic compound in which a phenolic nucleus is linked by a bismethylene group), a biphenyl-modified naphthol resin (a polyvalent naphthol compound in which a phenolic nucleus is linked by a bismethylene group), an aminotriazine-modified phenolic resin (a polyvalent phenolic compound in which a phenolic nucleus is linked by melamine or benzoguanamine), and an alkoxy group-containing aromatic ring-modified novolak resin (a polyvalent phenolic compound in which a phenolic nucleus and an alkoxy group-containing aromatic ring are linked by formaldehyde).

Among the other phenolic hydroxy group-containing resins, the cresol novolak resin or co-condensed novolak resin of cresol and other phenolic compounds is preferable, in order to be a photosensitive resin composition having high sensitivity and excellent heat resistance. The cresol novolak resin or co-condensed novolak resin of cresol and other phenolic compounds specifically is a novolak resin obtained by using at least one cresol selected from o-cresol, m-cresol, and p-cresol and an aldehyde compound as an essential raw material, and appropriately using other phenolic compounds in combination.

Examples of the other phenolic compounds include phenol; xylenol such as 2,3-xylenol, 2,4-xylenol, 2,5-xylenol, 2,6-xylenol, 3,4-xylenol, and 3,5-xylenol; ethylphenol such as o-ethylphenol, m-ethylphenol, p-ethylphenol; butylphenol such as isopropylphenol, butylphenol, p-t-butylphenol; alkylphenol such as p-penthylphenol, p-octylphenol, p-nonylphenol, p-cumylphenol; halogenated phenol such as fluorophenol, chlorophenol, bromophenol, and iodophenol; monosubstituted phenol such as p-phenylphenol, aminophenol, nitrophenol, dinitrophenol, and trinitrophenol; condensed polycyclic phenol such as 1-naphthol and 2-naphthol; and polyvalent phenol such as resorcin, alkyl resorcin, pyrogallol, catechol, alkyl catechol, hydroquinone, alkyl hydroquinone, phloroglucin, bisphenol A, bisphenol F, bisphenol S, and dihydroxynaphthalene. Each of the other phenolic compounds may be used alone, or two or more thereof may be used in combination. In the case where the other phenolic compounds are used, the use amount of the other phenolic compounds is in a range of 0.05 moles to 1 mole with respect to the total 1 mole of the cresol raw material.

In addition, the examples of the aldehyde compound include formaldehyde, paraformaldehyde, trioxane, acetaldehyde, propionaldehyde, polyoxymethylene, chloral, hexamethylene tetramine, furfural, glyoxal, n-butyraldehyde, caproaldehyde, allylaldehyde, benzaldehyde, crotonaldehyde, acrolein, tetraoxymethylene, phenylacetaldehyde, o-tolualdehyde, and salicylaldehyde. Each of the aldehyde compounds may be used alone, or two or more thereof may be used in combination. Among these, formaldehyde is preferable from a viewpoint of having excellent reactivity, and formaldehyde and other aldehyde compounds may be used in combination. In the case where formaldehyde and other aldehyde compounds are used in combination, the use amount of the other aldehyde compounds is preferably in a range of 0.05 moles to 1 mole with respect to 1 mole of formaldehyde.

With regard to a reaction ratio of the phenolic compound to the aldehyde compound when producing the novolak resin, the aldehyde compound is preferably in a range of 0.3 moles to 1.6 moles with respect to 1 mole of the phenolic compound, and more preferably in a range of 0.5 moles to 1.3 moles, in order to obtain a photosensitive resin composition having excellent sensitivity and heat resistance.

As the reaction of the phenolic compound and the aldehyde compound, a method of performing the reaction at a temperature of 60° C. to 140° C. in the presence of the acid catalyst, and then removing water or a residual monomer under reduced pressure can be exemplified. Examples of the acid catalyst used herein include an oxalic acid, a sulfuric acid, a hydrochloric acid, a phenol sulfonic acid, a paratoluene sulfonic acid, zinc acetate, and manganese acetate, and each of the acid catalysts may be used alone, or two or more thereof may be used in combination. Among the above, the oxalic acid is preferable from a viewpoint of having excellent catalytic activity.

Among the aforementioned cresol novolak resin, or the co-condensed novolak resin of cresol and other phenolic compounds, a cresol novolak resin using metacresol alone, or a cresol novolak resin using metacresol and paracresol in combination is preferable. In addition, in the case of the latter, a reaction molar ratio of metacresol to paracresol [metacresol/paracresol] is preferably in a range of 10/0 to 2/8, and more preferably 7/3 to 2/8, in order for the photosensitive resin composition to have excellent balance of sensitivity and heat resistance.

In the case where the other alkali-soluble resins are used, a blending ratio of the modified hydroxy naphthalene novolak resin of the present invention to the alkali-soluble resins can be arbitrarily adjusted according to the desired purpose. Among these, in order to sufficiently exhibit the effect of the present invention, which are high optical sensitivity, resolution, and alkali developability, and excellent heat resistance and moisture absorption resistance, the modified hydroxy naphthalene novolak resin of the present invention is preferably used in an amount of 60% by mass or more, and more preferably used in an amount of 80% by mass or more, with respect to the total amount of the modified hydroxy naphthalene novolak resin of the present invention and the other alkali-soluble resins.

The photosensitive composition of the present invention may further contain a photosensitizer commonly used for a resist material. Examples of the photosensitizer used herein include a compound having a quinone diazide group. The specific examples of the compound having the quinone diazide group include a compound in which an aromatic (poly)hydroxy compound and sulfonic acid having a quinone diazide group are completely esterified, a partially esterified compound, an amidated product, and a partially amidated product.

Examples of the aromatic (poly)hydroxy compound include a polyhydroxybenzophenone compound such as 2,3,4-trihydroxybenzophenone, 2,4,4'-trihydroxybenzophenone, 2,4,6-trihydroxybenzophenone, 2,3,6-trihydroxybenzophenone, 2,3,4-trihydroxy-2'-methylbenzophenone, 2,3,4,4'-tetrahydroxybenzophenone, 2,2',4,4'-tetrahydroxybenzophenone, 2,3',4,4',6-pentahydroxybenzophenone, 2,2',3,4,4'-pentahydroxybenzophenone, 2,2',3,4,5-pentahydroxybenzophenone, 2,3',4,4',5',6-hexahydroxybenzophenone, and 2,3,3',4,4',5'-hexahydroxybenzophenone;

a bis[(poly)hydroxy phenyl]alkane compound such as bis(2,4-dihydroxy phenyl)methane, bis(2,3,4-trihydroxyphenyl)methane, 2-(4-hydroxyphenyl)-2-(4'-hydroxyphenyl)propane, 2-(2,4-dihydroxyphenyl)-2-(2',4'-dihydroxyphenyl)propane, 2-(2,3,4-trihydroxyphenyl)-2-(2',3',4'-trihydroxyphenyl)propane, 4,4'-{1-[4-(2-(4-hydroxyphenyl)-2-propyl)phenyl]ethylidene}bisphenol, and 3,3'-dimethyl-{1-[4-(2-(3-methyl-4-hydroxyphenyl)-2-propyl)phenyl]ethylidene}bisphenol;

a tris(hydroxyphenyl)methane compound or methyl substitutes thereof such as tris(4-hydroxyphenyl)methane, bis(4-hydroxy-3,5-dimethyl phenyl)-4-hydroxyphenyl methane, bis(4-hydroxy-2,5-dimethyl phenyl)-4-hydroxyphenyl methane, bis(4-hydroxy-3,5-dimethyl phenyl)-2-hydroxyphenyl methane, bis(4-hydroxy-2,5-dimethyl phenyl)-2-hydroxyphenyl methane, bis(4-hydroxy-2,5-dimethyl phenyl)-3,4-dihydroxyphenyl methane, and bis(4-hydroxy-3,5-dimethyl phenyl)-3,4-dihydroxyphenyl methane;

a bis(cyclohexylhydroxyphenyl)(hydroxy phenyl)methane compound or methyl substitutes thereof such as bis(3-cyclohexyl-4-hydroxyphenyl)-3-hydroxyphenyl methane, bis(3-cyclohexyl-4-hydroxyphenyl)-2-hydroxyphenyl methane, bis(3-cyclohexyl-4-hydroxyphenyl)-4-hydroxyphenyl methane, bis(5-cyclohexyl-4-hydroxy-2-methyl phenyl)-2-hydroxyphenyl methane, bis(5-cyclohexyl-4-hydroxy-2-methyl phenyl)-3-hydroxyphenyl methane, bis(5-cyclohexyl-4-hydroxy-2-methyl phenyl)-4-hydroxyphenyl methane, bis(3-cyclohexyl-2-hydroxyphenyl)-3-hydroxyphenyl methane, bis(5-cyclohexyl-4-hydroxy-3-methyl phenyl)-4-hydroxyphenyl methane, bis(5-cyclohexyl-4-hydroxy-3-methyl phenyl)-3-hydroxyphenyl methane, bis(5-cyclohexyl-4-hydroxy-3-methyl phenyl)-2-hydroxyphenyl methane, bis(3-cyclohexyl-2-hydroxyphenyl)-4-hydroxyphenyl methane, bis(3-cyclohexyl-2-hydroxyphenyl)-2-hydroxyphenyl methane, bis(5-cyclohexyl-2-hydroxy-4-methyl phenyl)-2-hydroxyphenyl methane, and bis(5-cyclohexyl-2-hydroxy-4-methyl phenyl)-4-hydroxyphenyl methane.

Examples of the compound having a quinone diazide group include naphthoquinone-1,2-diazide-5-sulfonic acid, naphthoquinone-1,2-diazide-4-sulfonic acid, and orthoanthraquinone diazide sulfonic acid. Each of the photosensitizers which can be used in the present invention may be used alone, or two or more thereof may be used in combination.

In the case where the photosensitizer is used, a blending amount thereof is preferably in a range of 5 parts by mass to 30 parts by mass, with respect to 100 parts by mass of the resin solid content in the photosensitive composition of the present invention, in order to be a photosensitive composition having excellent optical sensitivity.

The photosensitive composition of the present invention may include a surfactant for the purpose of improving film forming properties or pattern adhesiveness, and reducing development defects in the case where the composition is used for the resist. Examples of the surfactant used above include nonionic surfactants such as a polyoxyethylene alkyl ether compound such as polyoxyethylene lauryl ether, polyoxyethylene stearyl ether, polyoxyethylene cetyl ether, and polyoxyethylene oleyl ether, a polyoxyethylene alkyl allyl ether compound such as polyoxyethylene octyl phenol ether and polyoxyethylene nonyl phenol ether, a sorbitan fatty acid ester compound such as polyoxyethylene.polyoxypropylene block copolymer, sorbitan monolaurate, sorbitan monopalmitate, sorbitan monostearate, sorbitan monooleate, sorbitan trioleate, and sorbitan tristearate, and a polyoxyethylene sorbitan fatty acid ester compound such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; a fluorine-based surfactant having a fluorine atom in a molecular structure such as a copolymer of a polymerizable monomer having a fluoro aliphatic group and [poly(oxyalkylene)](meth)acrylate; and a silicone-based surfactant having a silicone structural unit in a molecular structure. Each of the surfactants may be used alone, or two or more thereof may be used in combination.

A blending amount of the surfactant is preferably in a range of 0.001 parts by mass to 2 parts by mass with respect to 100 parts by mass of a resin solid content in the photosensitive composition of the present invention.

In the case where the photosensitive composition of the present invention is used for a photoresist, in addition to the modified hydroxy naphthalene novolak resin and the photoacid generator, if necessary, various additives such as an organic basic compound, other resins, a photosensitizer, surfactant, dye, filling material, crosslinking agent, and dissolution promoter are further added and dissolved in the organic solvent to form a resist material. The resist material may be used with a positive type resist solution as it is, or the resist material is applied in a film shape to remove a solvent and then may be used as a positive type resist film. As a support film when used as a resist film, a synthesized resin film such as polyethylene, polypropylene, polycarbonate, and polyethylene terephthalate can be exemplified, and the support film may be a monolayer film or a laminated film of plural layers. In addition, the surface of the support film may be subjected to a corona treatment or coated with a releasing agent.

Examples of the organic solvent used for the resist material of the present invention include alkylene glycol monoalkyl ether such as ethylene glycol monomethyl ether, ethylene glycol monoethyl ether, ethylene glycol monopropyl ether, and ethylene glycol monobutyl ether propylene glycol monomethyl ether; dialkylene glycol dialkyl ether such as diethylene glycol dimethyl ether, diethylene glycol diethyl ether, diethylene glycol dipropyl ether, and diethylene glycol dibutyl ether; alkylene glycol alkyl ether acetate such as ethylene glycol monomethyl ether acetate, ethylene glycol monoethyl ether acetate, and propylene glycol monomethyl ether acetate; a ketone compound such as acetone, methyl ethyl ketone, cyclohexanone, and methyl amyl ketone; cyclic ether such as dioxane; and an ester compound such as 2-hydroxy propionic acid methyl, 2-hydroxy propionic acid ethyl, 2-hydroxy-2-methyl propionic acid ethyl, ethoxyacetic acid ethyl, oxyacetic acid ethyl, 2-hydroxy-3-methyl butanoic acid methyl, 3-methoxybutyl acetate, 3-methyl-3-methoxybutyl acetate, formic acid ethyl, acetic acid ethyl, butyl acetate, acetoacetic acid methyl, and acetoacetic acid ethyl. Each of the solvents may be used singly, or two or more thereof may be used in combination.

The photosensitive composition of the present invention can be prepared by blending respective components described above and mixing the components using a stirrer. In addition, in the case where the photosensitive composition contains a filling material or a pigment, the composition can be adjusted by dispersing or mixing the material using a dispersion device such as a dissolver, a homogenizer, and a triple roll mill.

According to the photolithography method using the resist material including the photosensitive composition of the present invention, for example, the resist material is applied to an object, such as a silicon substrate, on which photolithography is to be performed, and prebaked at a temperature of 60° C. to 150° C. The application method at this time may be any method such as spin coating, roll coating, flow coating, dip coating, spray coating, and doctor blade coating. Next, the creation of a resist pattern is performed, since the resist material of the present invention is a positive type, the aimed resist pattern is exposed to light through a predetermined mask, and the part exposed to light is dissolved in an alkali developing solution to form a resist pattern.

Examples of the exposure light source include infrared light, visible light, ultraviolet light, far-ultraviolet light, X-rays, and electron beams, and the examples of the ultraviolet light include g-rays (wavelength of 436 nm), h-rays (wavelength of 405 nm), rays (wavelength of 365 nm), KrF excimer lasers (wavelength of 248 nm), ArF excimer lasers (wavelength of 193 nm), F2 excimer lasers (wavelength of 157 nm), and EUV lasers (wavelength of 13.5 nm) of a high-pressure mercury vapor lamp.

Since the photosensitive composition of the present invention has high optical sensitivity and alkali developability, it is possible to create a resist pattern having high resolution even in the case where any of the light sources are used.

EXAMPLES

Next, the present invention will be described in detail with reference to Examples and Comparative Examples, and the "parts" and "%" in the following are based on mass unless otherwise particularly indicated. In addition, GPC, 13C-NMR, and FD-MS spectrum were measured under the following conditions.

<GPC Measurement Conditions>
Measuring apparatus: "HLC-8220 GPC" manufactured by TOSOH CORPORATION (8.0 mm I.D.×300 mm)
Column: "Shodex KF802" manufactured by SHOWA DENKO K.K. (8.0 mm I.D.×300 mm)+"Shodex KF802" manufactured by SHOWA DENKO K.K. (8.0 mm I.D.×300 mm)+"Shodex KF803" manufactured by SHOWA DENKO K.K. (8.0 mm I.D.×300 mm)+"Shodex KF804" manufactured by SHOWA DENKO K.K. (8.0 mm I.D.×300 mm)
Detector: RI (differential refractometer)
Data processing: "GPC-8020 model II data analysis version 4.30" manufactured by TOSOH CORPORATION
Measurement Conditions:
Column temperature 40° C.
Eluent tetrahydrofuran (THF)
Flow rate 1.0 ml/minutes
Sample: A substance obtained by filtrating 1.0% by mass (in terms of a resin solid content) of a tetrahydrofuran solution with a micro filter (5 µl).
Standard sample: according to the measurement manual of the "GPC-8020 model II data analysis version 4.30", the following monodispersed polystyrene whose molecular weight is known is used.
(Monodispersed Polystyrene)
"A-500" manufactured by TOSOH CORPORATION
"A-2500" manufactured by TOSOH CORPORATION
"A-5000" manufactured by TOSOH CORPORATION
"F-1" manufactured by TOSOH CORPORATION
"F-2" manufactured by TOSOH CORPORATION
"F-4" manufactured by TOSOH CORPORATION
"F-10" manufactured by TOSOH CORPORATION
"F-20" manufactured by TOSOH CORPORATION
<13C-NMR Measurement Conditions>
Apparatus: "AL-400" manufactured by JOEL Ltd. Measurement mode: SGNNE (NOE elimination 1H complete decoupling method)
Solvent: dimethylsulfoxide
Pulse angle: 45° pulse
Sample concentration: 30% by weight
Cumulated number: 10,000 times
<FD-MS Spectrum Measurement Conditions>
FD-MS spectrum was measured using a double focusing mass spectrometer "AX505H (FD505H)" manufactured by JEOL Ltd.

Preparation Example 1

Preparation of Hydroxy Naphthalene Novolak Intermediate (1)

144 g of 1-naphthol (1.0 mole), 400 g of methylisobutylketone, 96 g of water, and 27.7 g of 92% paraformaldehyde (0.85 moles) were put into a 1 L four-necked flask equipped with a thermometer, a cooling tube, and a stirrer. Sequentially, 4.8 g of an aqueous solution of the paratoluenesulfonic acid prepared to have a concentration of 50% was added to the flask while stirring the flask. The amount of water within the reaction system was 69.9 parts by mass with respect to 100 parts by mass of 1-naphthol. After that, a reaction was performed by increasing the temperature up to 80° C. for 2 hours while stirring the flask. After the reaction was completed, a solution within the system was moved to a separating funnel, and an aqueous layer was separated from a methylisobutylketone layer and removed. Next, washing was performed with water until the washing water indicates neutral, and then methylisobutylketone was removed by heating under reduced pressure, thereby obtaining 147 g of a hydroxy naphthalene novolak intermediate (1). The GPC chart of the hydroxy naphthalene novolak intermediate (1) is shown in FIG. 1. The number average molecular weight (Mn) of the hydroxy naphthalene novolak intermediate (1) measured by GPC was 1,765, the weight average molecular weight (Mw) thereof was 3,337, the polydispersity (Mw/Mn) thereof was 1.890, the content of the monomer component in the hydroxy naphthalene novolak intermediate (1) was 0.49% by mass, and the content of the dimer component was 0.22% by mass.

Preparation Example 2

Preparation of Hydroxy Naphthalene Novolak Intermediate (2)

Figure 2:
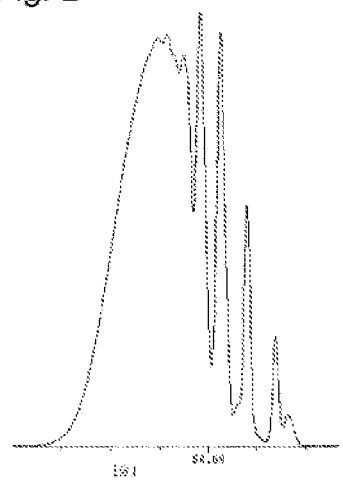
FIG. 2 is a GPC chart of a hydroxy naphthalene novolak intermediate (2) obtained in Preparation Example 2.

160 g of 2,7-dihydroxynaphthalene (1.0 mole), 400 g of methylisobutylketone, 96 g of water, and 27.7 g of 92% paraformaldehyde (0.85 moles) were put into a 1 L four-necked flask equipped with a thermometer, a cooling tube, a fractionating column, and a stirrer. Sequentially, 4.8 g of an aqueous solution of the paratoluenesulfonic acid prepared to have a concentration of 50% was added to the flask while stirring the flask. The amount of water within the reaction system was 62.9 parts by mass with respect to 100 parts by mass of 2,7-dihydroxynaphthalene. After that, a reaction was performed by increasing the temperature up to 80° C. for 2 hours while stirring the flask. After the reaction was completed, a solution within the system was moved to a separating funnel, and an aqueous layer was separated from a methylisobutylketone layer and removed. Next, washing was performed with water until the washing water indicates neutral, and then methylisobutylketone was removed by heating under reduced pressure, thereby obtaining 165 g of a hydroxy naphthalene novolak intermediate (2). The GPC chart of the hydroxy naphthalene novolak intermediate (2) is shown in FIG. 2. The number average molecular weight (Mn) of the hydroxy naphthalene novolak intermediate (2) measured by GPC was 1,142, the weight average molecular weight (Mw) thereof was 1,626, the polydispersity (Mw/Mn) thereof was 1.424, the content of the monomer component in the hydroxy naphthalene novolak intermediate (2) was 0.61% by mass, and the content of the dimer component was 1.79% by mass.

Example 1

Figure 3:
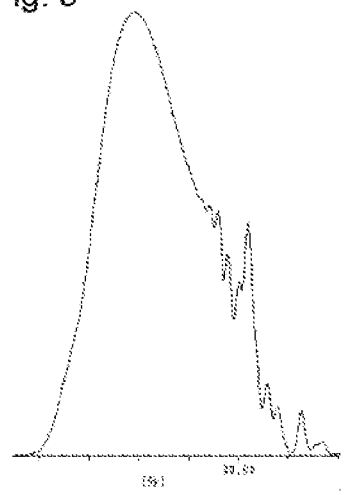
FIG. 3 is a GPC chart of a modified hydroxy naphthalene novolak resin (1) obtained in Example 1.
Figure 4:
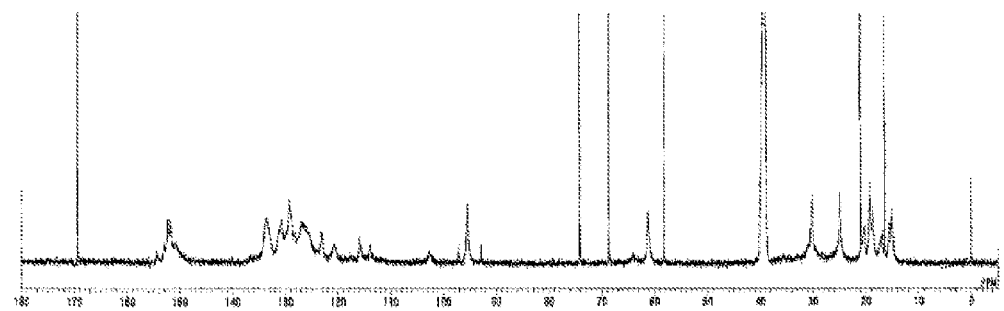
FIG. 4 is a 13C-NMR chart of the modified hydroxy naphthalene novolak resin (1) obtained in Example 1.

Preparation of Modified Hydroxy Naphthalene Novolak Resin 6.1 g of the hydroxy naphthalene novolak intermediate (1) obtained in the Preparation Example 1 and 1.7 g of dihydropyran were put into a 100 ml two-necked flask equipped with a cooling tube, and 30 g of 1,3-dioxolane was dissolved therein. After 0.01 g of a 35 wt % hydrochloric acid aqueous solution was added thereto, a reaction was performed at a temperature of 25° C. (room temperature) for 4 hours. After the reaction was completed, 0.1 g of 25 wt % ammonia aqueous solution was added thereto, the resultant was poured into 100 g of ion exchanged water to cause a product to be precipitated. A precipitate was dried at a temperature of 80° C. under reduced pressure of 1.3 kPa to obtain 5.9 g of a modified hydroxy naphthalene novolak resin (1) having a structural moiety (I) represented by Structural Formula (1) as a repeating unit. The GPC chart of the modified hydroxy naphthalene novolak resin (1) is shown in FIG. 3, and the 13C-NMR chart is shown in FIG. 4. The number average molecular weight (Mn) of the modified hydroxy naphthalene novolak resin (1) measured by GPC was 1,745, the weight average molecular weight (Mw) thereof was 3,401, and the polydispersity (Mw/Mn) thereof was 1.95. The existence ratio [(OX)/(OH)] of a tetrahydropyranyl group to a phenolic hydroxy group in the modified hydroxy naphthalene novolak resin (1) was 23/77. The repeating number of the structural moiety (I) (which corresponds to n in General Formula (2)) was 9.46 on average. In addition, the content of the monomer component in the modified hydroxy naphthalene novolak resin (1) was 0.33% by mass, and the content of the dimer component was 0.64% by mass.

Example 2

Figure 5:
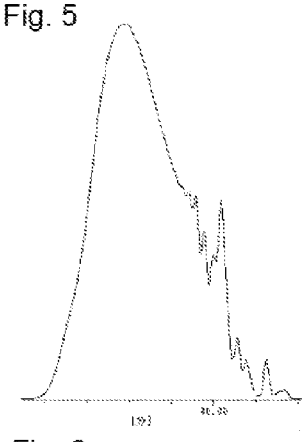
FIG. 5 is a GPC chart of a modified hydroxy naphthalene novolak resin (2) obtained in Example 2.

Same as the Above 5.8 g of a modified hydroxy naphthalene novolak resin (2) having a structural moiety (I) represented by Structural Formula (1) as a repeating unit was obtained in the same manner as Example 1, except that 1.7 g of dihydropyran in Example 1 was changed to 1.4 g of ethylvinylether. The GPC chart of the modified hydroxy naphthalene novolak resin (2) is shown in FIG. 5. The number average molecular weight (Mn) of the modified hydroxy naphthalene novolak resin (2) measured by GPC was 1,789, the weight average molecular weight (Mw) thereof was 3,515, and the polydispersity (Mw/Mn) thereof was 1.97. The existence ratio [(OX)/(OH)] of an ethoxymethyl group to a phenolic hydroxy group in the modified hydroxy naphthalene novolak resin (2) was 35/65. The repeating number of the structural moiety (I) (which corresponds to n in General Formula (2)) was 9.46 on average. In addition, the content of the monomer component in the modified hydroxy naphthalene novolak resin (2) was 0.28% by mass, and the content of the dimer component was 0.66% by mass.

Example 3

Figure 6:
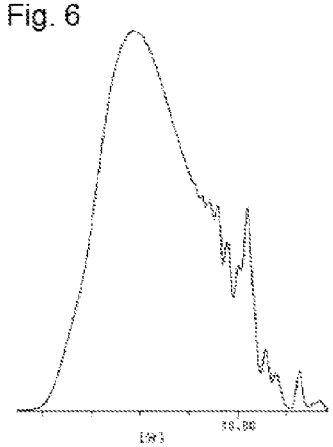
FIG. 6 is a GPC chart of a modified hydroxy naphthalene novolak resin (3) obtained in Example 3.

Same as the Above 6.1 g of the hydroxy naphthalene novolak intermediate (1) obtained in the Preparation Example 1 and 2.2 g of di-t-butyl dicarbonate were put into a 100 ml two-necked flask equipped with a cooling tube, and 30 g of 1,3-dioxolane was dissolved therein. After 0.1 g of triethylamine was added thereto, a reaction was performed at a temperature of 80° C. for 4 hours. After the reaction was completed, a reaction product was poured into 100 g of ion exchanged water, the obtained precipitate was dried at a temperature of 80° C. under reduced pressure of 1.3 kPa, thereby obtaining 6.2 g of a modified hydroxy naphthalene novolak resin (3) having a structural moiety (I) represented by Structural Formula (1) as a repeating unit. The GPC chart of the modified hydroxy naphthalene novolak resin (3) is shown in FIG. 6. The number average molecular weight (Mn) of the modified hydroxy naphthalene novolak resin (3) measured by GPC was 1,784, the weight average molecular weight (Mw) thereof was 3,487, and the polydispersity (Mw/Mn) thereof was 1.95. The existence ratio [(OX)/(OH)] of a t-butoxycarbonyl group to a phenolic hydroxy group in the modified hydroxy naphthalene novolak resin (3) was 27/73. The repeating number of the structural moiety (I) (which corresponds to n in General Formula (2)) was 9.46 on average. In addition, the content of the monomer component in the modified hydroxy naphthalene novolak resin (2) was 0.25% by mass, and the content of the dimer component was 0.63% by mass.

Example 4

Figure 7:
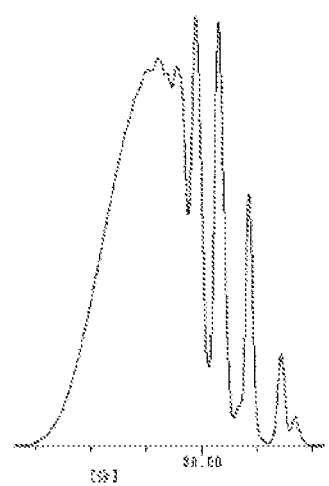
FIG. 7 is a GPC chart of a modified hydroxy naphthalene novolak resin (4) obtained in Example 4.

Same as the Above 2.9 g of a modified hydroxy naphthalene novolak resin (4) having a structural moiety (I) represented by Structural Formula (1) as a repeating unit was obtained in the same manner as Example 1, except that 6.1 g of the hydroxy naphthalene novolak intermediate (1) in Example 1 was changed to 3.3 g of the hydroxy naphthalene novolak intermediate (2). The GPC chart of the modified hydroxy naphthalene novolak resin (4) is shown in FIG. 7. The number average molecular weight (Mn) of the modified hydroxy naphthalene novolak resin (4) measured by GPC was 1,110, the weight average molecular weight (Mw) thereof was 1,547, and the polydispersity (Mw/Mn) thereof was 1.39. The existence ratio [(OX)/(OH)] of a tetrahydropyranyl group to a phenolic hydroxy group in the modified hydroxy naphthalene novolak resin (4) was 19/81. The repeating number of the structural moiety (I) (which corresponds to n in General Formula (2)) was 9.46 on average. In addition, the content of the monomer component in the modified hydroxy naphthalene novolak resin (4) was 0.56% by mass, and the content of the dimer component was 1.72% by mass.

Example 5

Figure 8:
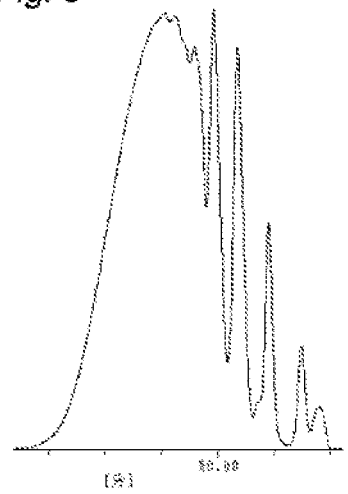
FIG. 8 is a GPC chart of a modified hydroxy naphthalene novolak resin (5) obtained in Example 5.

Same as the Above 3.1 g of a modified hydroxy naphthalene novolak resin (5) having a structural moiety (I) represented by Structural Formula (1) as a repeating unit was obtained in the same manner as Example 2, except that 6.1 g of the hydroxy naphthalene novolak intermediate (1) in Example 2 was changed to 3.3 g of the hydroxy naphthalene novolak intermediate (2). The GPC chart of the modified hydroxy naphthalene novolak resin (5) is shown in FIG. 8. The number average molecular weight (Mn) of the modified hydroxy naphthalene novolak resin (5) measured by GPC was 1,134, the weight average molecular weight (Mw) thereof was 1,663, and the polydispersity (Mw/Mn) thereof was 1.46. The existence ratio [(OX)/(OH)] of an ethoxyethyl group to a phenolic hydroxy group in the modified hydroxy naphthalene novolak resin (5) was 24/76. The repeating number of the structural moiety (I) (which corresponds to n in General Formula (2)) was 4.70 on average. In addition, the content of the monomer component in the modified hydroxy naphthalene novolak resin (5) was 0.97% by mass, and the content of the dimer component was 1.64% by mass.

Example 6

Figure 9:
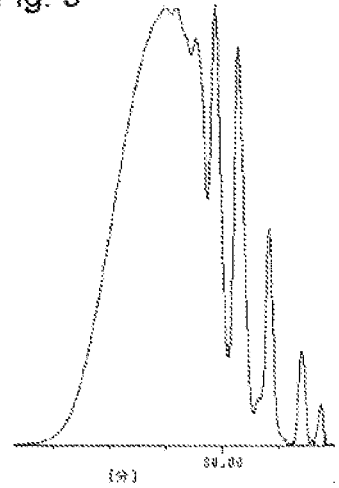
FIG. 9 is a GPC chart of a modified hydroxy naphthalene novolak resin (6) obtained in Example 6.

Same as the Above 3.0 g of a modified hydroxy naphthalene novolak resin (6) having a structural moiety (I) represented by Structural Formula (1) as a repeating unit was obtained in the same manner as Example 3, except that 6.1 g of the hydroxy naphthalene novolak intermediate (1) in Example 3 was changed to 3.3 g of the hydroxy naphthalene novolak intermediate (2). The GPC chart of the modified hydroxy naphthalene novolak resin (6) is shown in FIG. 9. The number average molecular weight (Mn) of the modified hydroxy naphthalene novolak resin (4) measured by GPC was 1,173, the weight average molecular weight (Mw) thereof was 1,675, and the polydispersity (Mw/Mn) thereof was 1.43. The existence ratio [(OX)/(OH)] of a t-butoxycarbonyl group to a phenolic hydroxy group in the modified hydroxy naphthalene novolak resin (6) was 26/74. The repeating number of the structural moiety (I) (which corresponds to n in General Formula (2)) was 4.70 on average. In addition, the content of the monomer component in the modified hydroxy naphthalene novolak resin (6) was 0.84% by mass, and the content of the dimer component was 1.73% by mass.

Preparation Example 3

Figure 10:
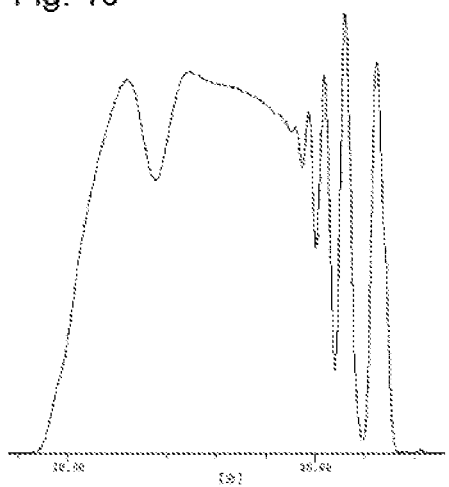
FIG. 10 is a GPC chart of a cresol novolak intermediate (1') obtained in Comparative Preparation Example 2.

Preparation of Cresol Novolak Intermediate (1') for Comparison and Control 648 g of m-cresol (6 moles), 432 g of p-cresol (4 moles), 2.5 g of oxalic acid (0.2 moles), and 492 g of 42% formaldehyde were put into a 2 L four-necked flask equipped with a stirrer and a thermometer, and the temperature of the resultant was increased up to 100° C. to perform a reaction. Distillation was performed by removing water at the increased temperature up to 200° C. under normal pressure, and distillation was performed at a temperature of 230° C. for 6 hours under reduced pressure, thereby obtaining 736 g of a cresol novolak intermediate (1') for comparison and control. The GPC chart of the cresol novolak intermediate (1') for comparison and control is shown in FIG. 10. The number average molecular weight (Mn) of the cresol novolak intermediate (1') for comparison and control measured by GPC was 1,450, the weight average molecular weight (Mw) thereof was 10,316, and the polydispersity (Mw/Mn) thereof was 7.12. In addition, the content of the monomer component of the cresol novolak intermediate (1') for comparison and control was 0.12% by mass, and the content of the dimer component was 5.86% by mass.

Comparative Example 1

Preparation of Modified Cresol Novolak Resin for Comparison and Control 4.6 g of a modified cresol novolak resin (1') for comparison and control was obtained in the same manner as Example 1 except that 6.1 g of the hydroxy naphthalene novolak intermediate (1) in Example 1 was changed to 4.6 g of the cresol novolak intermediate (1') for comparison and control obtained in Preparation Example 3. The number average molecular weight (Mn) of the modified cresol novolak resin (1') for comparison and control measured by GPC was 1,513, the weight average molecular weight (Mw) thereof was 10,758, and the polydispersity (Mw/Mn) thereof was 7.11. In addition, the existence ratio [(OX)/(OH)] of a tetrahydropyranyl group and a phenolic hydroxy group in the modified cresol novolak resin (1') for comparison and control was 47/53. In addition, the content of the monomer component in the modified cresol novolak resin (1') for comparison and control was 0.15% by mass, and the content of the dimer component was 6.08% by mass.

Comparative Example 2

Same as the Above 5.0 g of a modified cresol novolak resin (2') for comparison and control was obtained in the same manner as Example 2 except that 6.1 g of the hydroxy naphthalene novolak intermediate (1) in Example 2 was changed to 4.6 g of the cresol novolak intermediate (1') for comparison and control. The number average molecular weight (Mn) of the modified cresol novolak resin (2') for comparison and control measured by GPC was 1,816, the weight average molecular weight (Mw) thereof was 11,929, and the polydispersity (Mw/Mn) thereof was 6.57. In addition, the existence ratio [(OX)/(OH)] of an ethoxyethyl group and a phenolic hydroxy group in the modified cresol novolak resin (2') for comparison and control was 47/53. In addition, the content of the monomer component in the modified cresol novolak resin (2') for comparison and control was 0.26% by mass, and the content of the dimer component was 5.39% by mass.

Comparative Example 3

Same as the Above 5.0 g of a modified cresol novolak resin (3') for comparison and control was obtained in the same manner as Example 3 except that 6.1 g of the hydroxy naphthalene novolak intermediate (1) in Example 3 was changed to 4.6 g of the cresol novolak intermediate (1') for comparison and control. The number average molecular weight (Mn) of the modified cresol novolak resin (3') for comparison and control measured by GPC was 1,810, the weight average molecular weight (Mw) thereof was 11,862, and the polydispersity (Mw/Mn) thereof was 6.55. In addition, the existence ratio [(OX)/(OH)] of a t-butoxycarbonyl group and a phenolic hydroxy group in the modified cresol novolak resin (6') for comparison and control was 47/53. In addition, the content of the monomer component in the modified cresol novolak resin (3') for comparison and control was 0.20% by mass, and the content of the dimer component was 5.28% by mass.

Examples 7 to 12 and Comparative Examples 4 to 6

Various evaluation tests were performed according to the following manners with respect to each of the modified hydroxy naphthalene novolak resins (1) to (6) and the modified cresol novolak resins for comparison and control (1') to (3'). The results are shown in Tables 1 and 2.

<Preparation of Photosensitive Composition>

19 parts of the modified hydroxy naphthalene novolak resin or the modified cresol novolak resin for comparison and control, 1 part of a photoacid generator ["WPAG-336" diphenyl(4-methyl phenyl)sulfonium trifluoromethane sulfonate) manufactured by Wako Pure chemical Industries, Ltd.], and 80 parts of propylene glycol monomethyl ether acetate were mixed, and the mixture was filtrated by using a 0.2 μm membrane filter, thereby obtaining photosensitive compositions (1) to (6) and photosensitive compositions for comparison and control (1') to (3').

<Evaluation of Alkali Developability>

The photosensitive composition or the photosensitive composition for comparison and control was applied to a 5-inch silicon wafer by spin coating such that the thickness thereof becomes about 1 μm, and the composition was dried on a hot plate having a temperature of 110° C. for 60 seconds. Two pieces of this wafer were prepared, one was used as a "sample without light exposure" and the other was used as a "light-exposed sample". The sample was irradiated by 100 mJ/cm² of ghi rays using a hi-ray lamp ("multilight" manufactured by USHIO INC.), and then treated by heat at a temperature of 140° C. for 60 seconds.

Both the "sample without light exposure" and the "light-exposed sample" were immersed in an alkali developing solution (2.38% tetramethylammonium hydroxide aqueous solution) for 60 seconds, and then dried on a hot plate having a temperature of 110° C. for 60 seconds. The thickness of the film was measured before and after the immersion into the developing solution, and an alkali developability [ADR (Å/s)] can be obtained by dividing the difference by 60.

<Evaluation of Optical Sensitivity>

The photosensitive composition or the photosensitive composition for comparison and control was applied to a 5-inch silicon wafer by spin coating such that the thickness thereof becomes about 1 μm, and the composition was dried on a hot plate having a temperature of 110° C. for 60 seconds. A line and a space on the obtained wafer was 1:1, a resist mask in which a line width is set from 1 μm to 10 μm for every 1 μm was tightly attached thereto. The wafer was irradiated with ghi rays in the same manner as the previous case of evaluating the alkali developability, and alkali development operation was performed. The exposure amount of the ghi rays was increased from 30 mJ/cm² for every 5 mJ/cm², and the exposure amount (Eop exposure amount) which can sufficiently reproduce the line width of 3 μm was evaluated.

<Evaluation of Resolution>

The photosensitive composition or the photosensitive composition for comparison and control was applied to a 5-inch silicon wafer by spin coating such that the thickness thereof becomes about 1 μm, and the composition was dried on a hot plate having a temperature of 110° C. for 60 seconds. A photomask was laid on the obtained wafer, the wafer was irradiated with 100 mJ/cm² of the ghi rays in the same manner as the previous case of evaluating the alkali developability, and alkali development operation was performed. A pattern shape was confirmed using a laser microscope ("VK-8500" manufactured by KEYENCE CORPORATION), a wafer which is resolved to have L/S=5 μm is indicated by A, and which is not resolved to have L/S=5 μm is indicated by B.

<Evaluation of Heat Resistance>

The photosensitive composition or the photosensitive composition for comparison and control was applied to a 5-inch silicon wafer by spin coating such that the thickness thereof becomes about 1 μm, and the composition was dried on a hot plate having a temperature of 110° C. for 60 seconds. A resin fraction was scratched off from the obtained wafer, and the glass transition temperature (Tg) thereof was measured. The measurement of the glass transition temperature (Tg) was performed using a differential scanning calorimeter (DSC) ("Q100" manufactured by TA Instruments, Japan) under a nitrogen atmosphere, at a temperature range of −100° C. to 200° C., and a temperature rising rate of 10° C./minutes.

<Evaluation of Moisture Absorbing Properties>

The photosensitive composition or the photosensitive composition for comparison and control was applied to a 5-inch silicon wafer by spin coating such that the thickness thereof becomes about 1 μm, and the composition was dried on a hot plate having a temperature of 110° C. for 60 seconds. The obtained wafer was made to absorb moisture at a temperature of 85° C., a humidity of 85% for 24 hours, and a moisture absorbing rate was calculated from a mass change before and after the absorption of moisture.

TABLE 1

|  | Example 7 | Example 8 | Example 9 | Example 10 | Example 11 | Example 12 |
|---|---|---|---|---|---|---|
| Hydroxy naphthalene novolak intermediate | (1) | (1) | (1) | (2) | (2) | (2) |
| Modified hydroxy naphthalene novolak resin (1) | 19 | — | — | — | — | — |
| Modified hydroxy naphthalene novolak resin (2) | — | 19 | — | — | — | — |
| Modified hydroxy naphthalene novolak resin (3) | — | — | 19 | — | — | — |
| Modified hydroxy naphthalene novolak resin (4) | — | — | — | 19 | — | — |
| Modified hydroxy naphthalene novolak resin (5) | — | — | — | — | 19 | — |
| Modified hydroxy naphthalene novolak resin (6) | — | — | — | — | — | 19 |
| Photosensitizer | 1 | 1 | 1 | 1 | 1 | 1 |
| Propylene glycol monomethyl ether acetate | 80 | 80 | 80 | 80 | 80 | 80 |
| Substitution rate of protective group [mol %] | 23 | 35 | 27 | 19 | 24 | 26 |
| Evaluation of alkali developability "Sample without light exposure" | 0 | 0 | 0 | 0 | 0 | 0 |
| "Light-exposed sample" | 520 | 350 | 470 | 260 | 490 | 340 |
| Evaluation of photosensitivity [mJ/cm$^2$] | 40 | 40 | 40 | 45 | 40 | 40 |
| Evaluation of resolution | A | A | A | A | A | A |
| Evaluation of heat resistance [° C.] | 187 | 156 | 174 | 185 | 168 | 178 |
| Evaluation of moisture absorbing rate [mass %] | 0.9 | 0.9 | 0.9 | 1.1 | 1.2 | 1.1 |

TABLE 2

|  | Comparative Example 4 | Comparative Example 5 | Comparative Example 6 |
|---|---|---|---|
| Modified cresol novolak resin (1') | 19 | — | — |
| Modified cresol novolak resin (2') | — | 19 | — |
| Modified cresol novolak resin (3') | — | — | 19 |
| Photosensitizer | 1 | 1 | 1 |
| Propylene glycol monomethyl ether acetate | 80 | 80 | 80 |
| Substitution rate of protective group [mol %] | 47 | 47 | 47 |
| Evaluation of alkali developability "Sample without light exposure" | 0 | 0 | 0 |
| "Light-exposed sample" | 110 | 150 | 130 |
| Evaluation of photosensitivity [mJ/cm$^2$] | 150 | 150 | 145 |
| Evaluation of resolution | B | B | B |
| Evaluation of heat resistance [° C.] | 52 | 36 | 44 |
| Evaluation of moisture absorbing rate [mass %] | 1.9 | 2.2 | 2.0 |

The invention claimed is:

1. A modified hydroxy naphthalene novolak resin comprising a structural moiety (I) represented by Structural Formula (1) as a repeating unit:

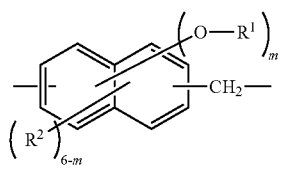

(1)

wherein R$^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group; m is 1 or 2, and when m is 2, the two R$^1$'s may be the same as or different from each other; and R$^2$'s each independently is any one of a hydrogen atom, an alkyl group, an alkoxy group, an aryl group, an aralkyl group, and a halogen atom, wherein at least one of R$^1$'s present in the resin is any one of a tertiary alkyl group, an alkoxyalkyl group, an acyl group, an alkoxycarbonyl group, a hetero atom-containing cyclic hydrocarbon group, and a trialkylsilyl group, and wherein the modified hydroxy naphthalene novolak resin further comprises a dimer component represented by any one of Structural Formula (3), and the total content of the dimer component in the resin is 5% by mass or less in terms of an area ratio of GPC measurement:

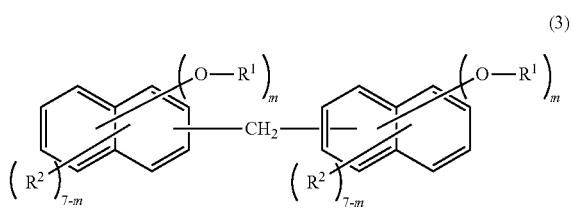

(3)

wherein R$^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group; m is 1 or 2; and R$^2$'s each independently is any one of a hydrogen atom, an alkyl group, an alkoxy group, an aryl group, an aralkyl group, and a halogen atom.

2. The modified hydroxy naphthalene novolak resin according to claim 1, comprising a structural moiety represented by Structural Formula (1-1) or (1-2) as a repeating unit:

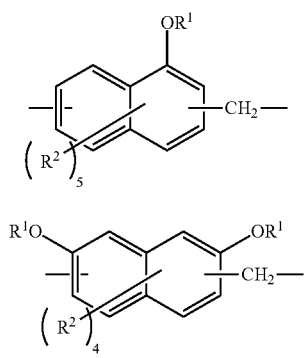

(1-1)

(1-2)

wherein $R^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group, and $R^2$'s each independently is any one of a hydrogen atom, an alkyl group, an alkoxy group, an aryl group, an aralkyl group, and a halogen atom.

3. The modified hydroxy naphthalene novolak resin according to claim 1,
wherein the total content of a monomer component represented by Structural Formula (4) in the resin is 2% by mass or less in terms of an area ratio of GPC measurement:

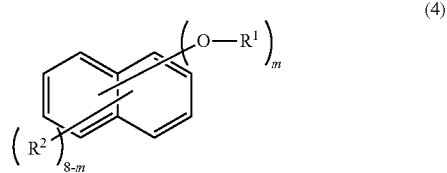

(4)

wherein $R^1$ is any one of a hydrogen atom, a tertiary alkyl group, an alkoxyalkyl group, an acyl group, an alkoxycarbonyl group, a hetero atom-containing cyclic hydrocarbon group, and a trialkylsilyl group; m is 1 or 2, and when m is 2, the two $R^1$'s may be the same as or different from each other; and $R^2$'s each independently is any one of a hydrogen atom, an alkyl group, an alkoxy group, an aryl group, an aralkyl group, and a halogen atom.

4. The modified hydroxy naphthalene novolak resin according to claim 1,
wherein, with respect to the structural moiety represented by —O—$R^1$ in Structural Formula (1) (where R′ is any one of a hydrogen atom, a tertiary alkyl group, an alkoxyalkyl group, an acyl group, an alkoxycarbonyl group, a hetero atom-containing cyclic hydrocarbon group, and a trialkylsilyl group), an existence ratio [(OX)/(OH)] of the structural moiety (OX) in which $R^1$ is any one of a tertiary alkyl group, an alkoxyalkyl group, an acyl group, an alkoxycarbonyl group, a hetero atom-containing cyclic hydrocarbon group, and a trialkylsilyl group to the structural moiety (OH) in which $R^1$ is a hydrogen atom, is in a range of 5/95 to 50/50.

5. The modified hydroxy naphthalene novolak resin according to claim 1, comprising:
a chemical structure in which a part of hydrogen atoms of phenolic hydroxy groups of a hydroxy naphthalene novolak intermediate is substituted with any one of a tertiary alkyl group, an alkoxyalkyl group, an acyl group, an alkoxycarbonyl group, a cyclic ether structural moiety, and a trialkylsilyl group,
wherein the hydroxy naphthalene novolak intermediate is one obtained by reacting a hydroxy naphthalene compound and formaldehyde in a mixed solvent of a hydrophobic organic solvent and water under the condition of an acid catalyst.

6. A photosensitive composition comprising:
the modified hydroxy naphthalene novolak resin according to claims 1; and a photoacid generator.

7. A resist material comprising the photosensitive composition according to claim 6.

8. A coating formed of the photosensitive composition according to claim 6.

* * * * *